United States Patent [19]

Kelly et al.

[11] Patent Number: 5,506,539
[45] Date of Patent: Apr. 9, 1996

[54] IGFET POWER SEMICONDUCTOR CIRCUIT WITH GAE CONTROL AND FAULT DETECTION CIRCUITS

[75] Inventors: Brendan P. Kelly, Stockport; Paul T. Moody, Oldham, both of England

[73] Assignee: U.S. Philips Corporation, Tarrytown, N.Y.

[21] Appl. No.: 263,701

[22] Filed: Jun. 22, 1994

[30]    Foreign Application Priority Data

Jun. 22, 1993 [GB] United Kingdom ............... 9312814.8
Apr. 14, 1994 [GB] United Kingdom ............... 9407443.2

[51] Int. Cl.$^6$ ...................................................... H03K 17/16
[52] U.S. Cl. ........................................... 327/379; 327/427
[58] Field of Search ........................... 327/108–112, 308, 327/309, 310, 313, 314, 379, 380, 381, 427; 361/13, 18, 58, 86, 88, 91, 100, 101

[56]    References Cited

U.S. PATENT DOCUMENTS

| | | | |
|---|---|---|---|
| 4,115,740 | 9/1978 | Yoshida et al. | 330/264 |
| 4,860,148 | 8/1989 | Iwamura et al. | 361/58 |
| 4,928,053 | 5/1990 | Sicard et al. | 323/284 |
| 4,931,668 | 6/1990 | Kikuda et al. | 326/29 |
| 5,173,622 | 12/1992 | Maemura | 326/21 |
| 5,173,848 | 12/1992 | Roof | 363/56 |
| 5,231,311 | 7/1993 | Ferry et al. | 326/27 |
| 5,278,422 | 1/1994 | Kato et al. | 250/551 |
| 5,305,191 | 4/1994 | Loftus, Jr. | 327/108 |
| 5,347,169 | 9/1994 | Preslar et al. | 327/110 |

FOREIGN PATENT DOCUMENTS

| | | |
|---|---|---|
| 0372820 | 6/1990 | European Pat. Off. . |
| 0523800 | 1/1993 | European Pat. Off. . |
| 2281815 | 3/1995 | United Kingdom . |

OTHER PUBLICATIONS

Elektronik, vol. 38, No. 10, 12 May 1989, Munich, DE pp. 55–63; H. Hassig et al. "Zuverlassiger Betrieb von MOS-FETs in Bruckenschaltungen".
Elektronik, vol. 42, No. 4, 23 Feb. 1993, Munich, DE pp. 24–27. H. Lemme "Sichere Schaltungen mit TOPFET".

Primary Examiner—Timothy P. Callahan
Assistant Examiner—Jeffrey Zweizig
Attorney, Agent, or Firm—Edward Blocker; Bernard Franzblau

[57]    ABSTRACT

A power semiconductor device circuit has an insulated gate field effect power semiconductor device with first and second main electrodes and a gate electrode. A gate control circuit provides a conductive path between the gate electrode and a gate voltage supply terminal. The gate control circuit has a resistance coupled between the gate electrode and the gate voltage supply terminal. A switching device has first and second main electrodes coupled to the gate voltage supply terminal and the gate electrode, respectively, so that the main current path between the first and second main electrodes is coupled in parallel with the resistance, the switching device having a first non-conducting state and a second conducting state for providing, in the second conducting state, an additional resistance in parallel with the resistance. The switching device switches from one of the first and second states to the other when the voltage at the gate voltage supply terminal changes in order to turn the power semiconductor device on or off, or upon the detection of a fault condition within the power semiconductor device. In either case, the overall resistance of the conductive path between the gate electrode and the gate voltage supply terminal is altered.

19 Claims, 3 Drawing Sheets

IGFET POWER SEMICONDUCTOR CIRCUIT WITH GAE CONTROL AND FAULT DETECTION CIRCUITS

BACKGROUND OF THE INVENTION

This invention relates to a power semiconductor circuit comprising an insulated gate field effect power semiconductor device and a gate control circuit for controlling the application of voltages to the insulated gate electrode of the power semiconductor device.

U.S. Pat. No. 4,928,053 describes a power semiconductor device circuit in which the power semiconductor device is an n-channel power MOSFET intended to be used as a high-side switch for an inductive load. As will be understood by those skilled in the art, a 'high-side switch' in the case of an n-channel device is a switch which is coupled between the load and the more positive of the two voltage supply lines. In the circuit described in U.S. Pat. No. 4,928,053, a voltage clamping circuit in the form of a zener diode is coupled between the positive voltage supply terminal, to which one main electrode of the power semiconductor device is coupled, and the gate electrode of the power semiconductor device. The main current path, that is the current path between its main electrodes, of an n-channel MOS transistor is coupled between the gate and the other main electrode of the power semiconductor device. The gate electrode of the n-channel MOST is coupled together with the gate electrode of a p-channel MOST to the other supply line which is, as shown, at ground. The main current path of the p-channel MOS transistor is coupled between the gate electrode of the power MOSFET and a gate drive circuit. In the operation of the circuit described in U.S. Pat. No. 4,928,053 when an overvoltage occurs due to the switching of the inductive load, the zener diode breaks down and the n-channel MOS transistor provides a conduction path, bypassing the power semiconductor device, for dissipation of the energy in the inductive load. At the same time, the p-channel MOS is switched off thereby isolating the power MOSFET from the gate drive circuit.

SUMMARY OF THE INVENTION

It is an aim of the present invention to provide a power semiconductor device circuit having a gate control circuit to facilitate switching on or off of the power semiconductor device.

According to the present invention, there is provided a power semiconductor device circuit comprising an insulated gate field effect power semiconductor device having first and second main electrodes and a gate electrode and a gate control circuit providing a conductive path between the gate electrode and a gate voltage supply terminal. The gate control circuit comprises a resistance coupled between the gate electrode and the gate voltage supply terminal and a switching device having first and second main electrodes coupled to the gate voltage supply terminal and the gate electrode, respectively, so that the main current path between the first and second main electrodes of the switching device is coupled in parallel with the resistance. The switching device has a first non-conducting state and a second conducting state for providing, in the second conducting state, an additional resistance in parallel with the resistance, the switching device being arranged to switch from one of the first and second states to the other when the voltage at the gate voltage supply terminal changes in order to turn the power semiconductor device on or off, or upon the detection of a fault condition within the power semiconductor device, so as to alter the overall resistance of the conductive path between the gate electrode and the gate voltage supply terminal.

Thus, in a circuit in accordance with the invention, the overall resistance of the conductive path between the gate voltage supply terminal and the gate electrode of the power semiconductor device can be modified or altered by controlling the conduction of a switching device connected in parallel with the resistance in response to changes in the voltage at the gate voltage supply terminal or detection of a fault condition. This should enable the switching speed of the power semiconductor device to benefit from any ac signal type low impedance gate drive circuit coupled to the gate voltage supply terminal during normal operation of the power semiconductor device, but allow the overall resistance of the conductive path between the gate electrode and the gate voltage supply terminal to be adjusted under abnormal conditions of the power semiconductor device to reduce the problems any such low impedance drive might otherwise cause.

The switching device may comprise a rectifying diode coupled in parallel with the resistance. The rectifying diode may be arranged to conduct when the gate voltage supply terminal changes in order to turn the power semiconductor device off.

As an alternative the switching device may comprise a transistor and means may be provided for applying a control signal to the control electrode of the transistor to cause the transistor to switch between the first and second states.

In a first example, where the gate control circuit is provided to facilitate turn off of the power semiconductor device when the gate voltage is removed from the gate voltage supply terminal, the transistor may comprise an insulated gate field effect transistor and the control signal applying means may comprise a coupling between the control electrode of the transistor and the gate electrode of the power semiconductor device for causing the transistor to be rendered conducting when the gate voltage is removed from the gate voltage supply terminal thereby reducing the overall resistance between the gate electrode and the gate voltage supply terminal.

A resistance may be coupled in series with the transistor to enable the switching speed of the power semiconductor device to be adjusted.

The gate control circuit thus provides the desired relatively high resistance in the conductive path between the gate voltage supply terminal and the gate electrode of the power semiconductor device during normal turn on of the device and enables the resistance of the conductive path to be reduced automatically when the gate voltage is removed in order to switch off the power semiconductor device, so reducing the time taken for the power semiconductor to be switched off.

In a second example, a fault detection circuit may be provided for detecting an abnormal condition of the power semiconductor device, the fault detection circuit having a control output for providing an output signal for switching off the power semiconductor device when an abnormal condition is detected, and the means for applying the control signal to the transistor may comprise a further resistance coupled in series with the main current path between first and second main electrodes of a further transistor to a voltage supply, the first main electrode of the further transistor being coupled to the further resistance and the control electrode of the transistor so that the transistor is normally conducting, the further transistor having a control electrode coupled to the output of the fault detection circuit for causing, when the fault detection circuit provides an output signal indicating the existence of an abnormal condition, the further transistor to be rendered conducting thereby causing the transistor to become non-conducting, so increasing the overall resistance of the conductive path between the gate voltage supply terminal and the gate electrode of the power semiconductor device.

In this case, the gate control circuit acts to increase the resistance of the conductive path to the gate voltage supply terminal when the fault detection circuit detects an abnormal condition of the power semiconductor device due, for example, to the switching of an inductive load. This should facilitate turn off of the power semiconductor device by the fault detection circuit.

In a third example, a fault detection circuit may be provided for detecting an abnormal condition of the power semiconductor device, the fault detection circuit having a control output for providing an output signal for switching off the power semiconductor device when an abnormal condition is detected, and the gate control circuit may additionally comprise a transistor having first and second main electrodes and a control electrode with the first and second main electrodes coupled to the gate voltage supply terminal and the gate electrode, respectively, so that the main current path between the first and second main electrodes of the transistor is coupled in parallel with the resistance, means for applying a control signal to the transistor comprising another resistance coupled in series with the main current path between first and second main electrodes of a further transistor to a voltage supply, the first main electrode of the further transistor being coupled to the said other resistance and the control electrode of the transistor so that the transistor is normally conducting, the further transistor having a control electrode coupled to the output of the fault detection circuit for causing, when the fault detection circuit provides an output signal indicating the existence of an abnormal condition the further transistor to be rendered conducting thereby causing the transistor to become non-conducting, so increasing the overall resistance of the conductive path between the gate voltage supply terminal and the gate electrode. Such a circuit provides the functions of the first and second examples discussed above.

In the second and third examples, the fault detection circuit may have its control output coupled to the control electrode of a fault detection transistor which has one of its first and second main electrodes coupled to the gate electrode of the power semiconductor device and the other to a voltage supply so that when the fault detection transistor is rendered conducting by the output signal from the fault detection circuit the power semiconductor device is switched off.

A voltage clamping circuit may be coupled between one of the first and second main electrodes and the gate electrode of the power semiconductor device for causing the power semiconductor device to be switched from a non-conducting to a conducting state when the voltage at the one main electrode exceeds a predetermined limit.

It should be noted that U.S. Pat. No. 5,173,848 describes a motor controller in which the series resistance between the gate drive circuit and the insulated gate of an insulated gate bipolar transistor (IGBT) has a switchable FET (Field Effect Transistor) coupled in parallel with a resistance in the conductive path to the insulated gate of the IGBT. The switchable FET is normally conducting; however a sensing circuit is provided to switch off the FET when the load voltage of the IGBT falls below a given value to cause a relatively slow transition from turn on to turn off to avoid an overshoot voltage.

BRIEF DESCRIPTION OF THE DRAWING

Embodiments of the invention will now be described with reference to the accompanying drawings, in which.

It should of course be understood that the same reference numerals are used throughout the drawings to refer to like parts.

DETAILED DESCRIPTION OF THE PREFERRED EMBODIMENT

Figure 1:
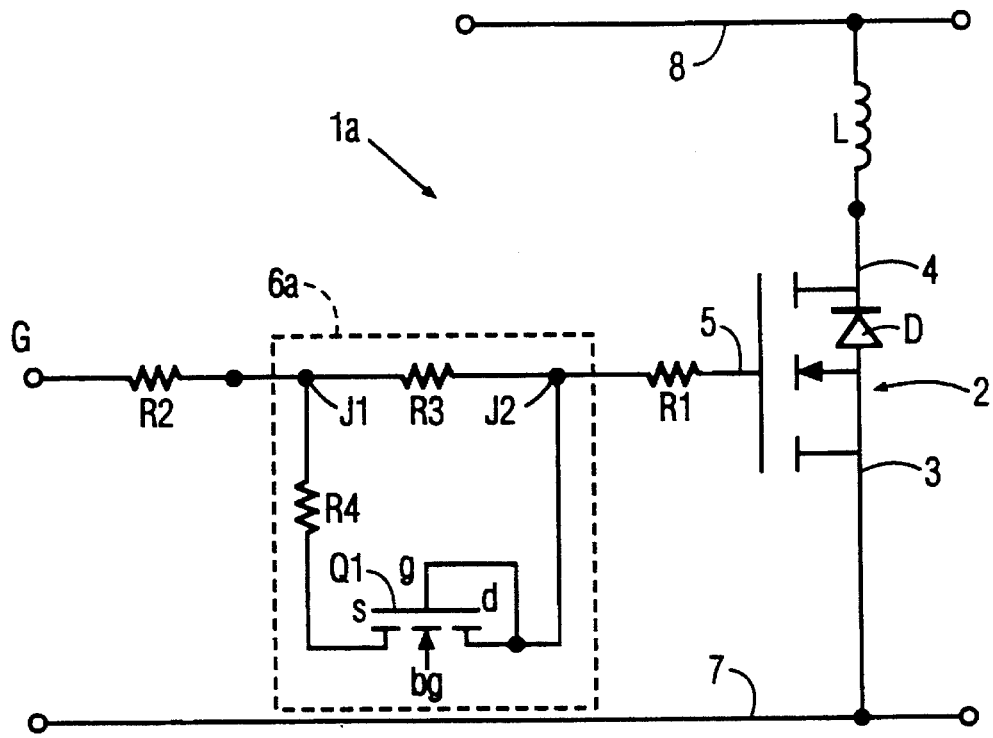
FIG. 1 is a circuit diagram of a first embodiment of a power semiconductor device circuit in accordance with the invention.

Referring now to the drawings, there are illustrated various examples of power semiconductor device circuits 1a, 1b, 1c, 1d each comprising an insulated gate field effect power semiconductor device 2 having first and second main electrodes 3 and 4 and a gate electrode 5 and a gate control circuit 6a, 6b, 6c, 6d providing a conductive path between the gate electrode 5 and a gate voltage supply terminal G, the gate control circuit 6 comprising a resistance R3 coupled between the gate electrode 5 and the gate voltage supply terminal G and a switching device Q1, D1, Q2 having first and second main electrodes coupled to the gate voltage supply terminal G and the gate electrode 5, respectively, so that the main current path between the first and second main electrodes is coupled in parallel with the resistance R3, the switching device Q1, D1, Q2 having a first non-conducting state and a second conducting state for providing, in the second conducting state an additional resistance in parallel with the resistance R3, the switching device being arranged to switch from one of the first and second states to the other when the voltage at the gate voltage supply terminal G changes in order to turn the power semiconductor device 2 on or off so as to alter the overall resistance of the conductive path between the gate electrode 5 and the gate voltage supply terminal G.

Thus, in a circuit in accordance with the invention, the overall resistance $R_{TOT}$ of the conductive path between the gate voltage supply terminal G and the gate electrode 5 of the power semiconductor device 2 can be modified or altered by controlling the conduction of a transistor Q1, Q2 connected in parallel with the resistance R3 in response to the change in the voltage at the gate voltage supply terminal or the detection of a fault condition. This should enable the switching speed of the power semiconductor device to benefit from any ac signal type low impedance gate drive circuit coupled to the gate voltage supply terminal during normal operation of the power semiconductor device but allow the overall resistance of the conductive path between the gate electrode and the gate voltage supply terminal to be adjusted under abnormal conditions of the power semiconductor device to reduce the problems any such low impedance drive might otherwise cause.

Referring now to the example illustrated in FIG. 1, the power semiconductor device circuit 1a has first and second power supply lines 7 and 8. In this example, the power semiconductor device 2 is an n-channel enhancement mode power MOSFET forming a low-side switch for a load L. The diode D shown in the power MOSFET 2 symbol represents the diode formed between the drain and body (channel-defining region) of a DMOS type vertical MOSFET. The load L may be an inductive load such as may occur in an automobile, for example, an electric motor or a coil such as an ignition coil. The second power supply line 8 is thus at a positive voltage compared to the first power supply line 7 which will generally be at ground (earth) potential.

The gate electrode 5 of the power MOSFET 2 is coupled to the gate terminal G by, in this example, a first resistor R1, the gate control circuit 6a and a second resistor R2.

Any suitable form of gate drive circuit (not shown) may be provided for supplying a gate voltage to the gate terminal G.

The power semiconductor device circuit 2 may include temperature sensors, clamping circuits and dV/dt limiting circuits of a suitable nature which may be integrated with the power semiconductor device 2.

The gate control circuit 6a shown in FIG. 1 comprises a third resistor R3 provided between and in series with the first and second resistors R1 and R2. A n-channel enhancement mode insulated gate field transistor (IGFET) Q1 has its main current path (ie that between source and drain) coupled across the resistance R3 with the source electrode s of the IGFET Q1 coupled to the junction J1 between the second and third resistors R2 and R3 by a fourth resistor R4 and the drain electrode d of the IGFET Q1 coupled to the junction J2 between the first and third resistors R1 and R3. The gate electrode g of the IGFET Q1 is coupled to its drain electrode d.

FIG. 1 shows the back gate electrode bg of the IGFET Q1 as uncoupled. However, in practice the back gate electrode bg will either be coupled to the source electrode s in conventional manner or to the first supply line 7.

In the operation of the power semiconductor device circuit 1a, the power semiconductor device 2, in normal operation, is switched on by the application of an appropriate positive voltage to the gate voltage supply terminal G by the gate drive circuitry (not shown).

During this phase the IGFET Q1 remains non-conducting or off and the total resistance of the conductive path between the gate voltage supply terminal G and the gate electrode 5 is the sum of the resistance R1, R2 and R3.

In order to turn off the power semiconductor device 2, the gate drive circuitry removes the gate voltage. At this stage, the voltage at the drain d (and thus the gate g) of the IGFET Q1 becomes higher than the voltage at its source and the IGFET Q1 becomes conductive thus connecting the resistor R4 and the small resistance of the IGFET Q1 in parallel with the third resistor R3, so reducing the overall resistance $R_{TOT}$ of the conductive path between the gate voltage supply terminal G and the gate electrode 5 of the power MOSFET 2.

The gate control circuit 6a thus enables the desired relatively high resistance to be provided in the conductive path between the gate voltage supply terminal G and the gate electrode 5 of the power semiconductor device 2 during normal turn on of the power semiconductor device 2 and enables the resistance of the conductive path to be reduced automatically when the gate voltage is removed in order to switch off the power semiconductor device, so reducing the time taken for the power device 2 to be switched off.

Figure 2:
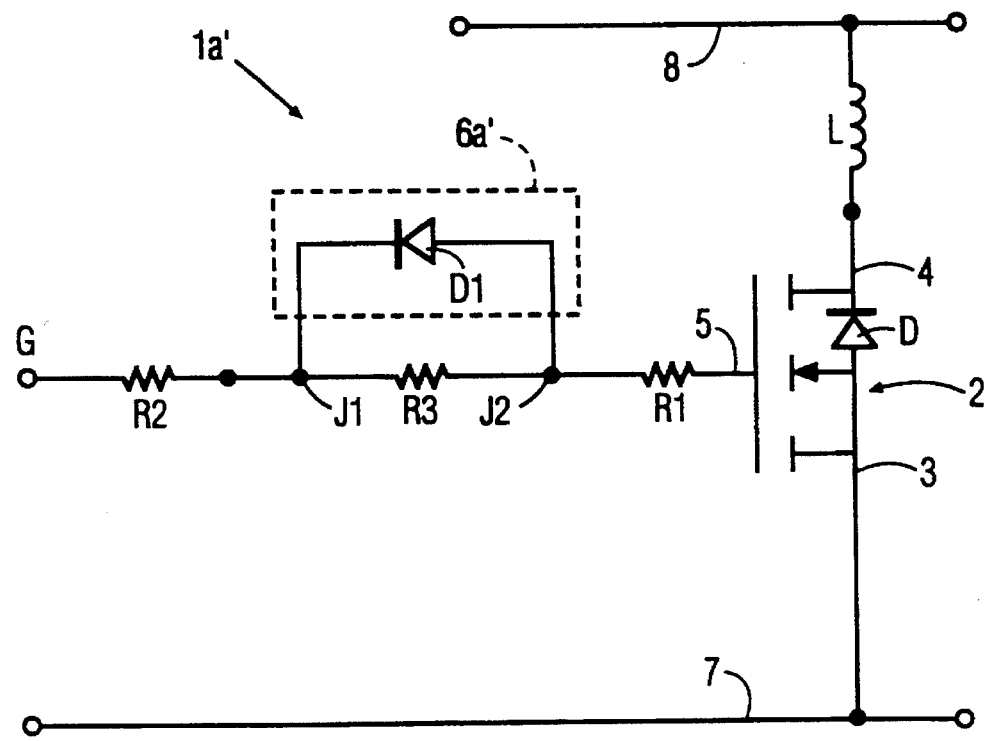
FIG. 2 is a circuit diagram of a modified version of the first embodiment.

FIG. 2 illustrates a modified version 1a' of the circuit 1a shown in FIG. 1 in which the transistor Q1 of the gate control circuit 6a' is replaced by a rectifying diode D1 which is preferably in the form of a thin-film, generally polycrystalline silicon, diode formed on an insulating layer provided over the semiconductor body within which the power semiconductor device 2 is formed.

In operation of the circuit 1a' shown in FIG. 2, when the gate drive circuitry removes the gate voltage, the diode D1 (which is reverse-biassed while the gate voltage is applied to cause the power semiconductor device 2 to conduct) becomes forward-biassed and thus conducts so that the forward resistance of the diode D1 is placed in parallel with the third resistor R3, so reducing the overall resistance $R_{TOT}$ of the conductive path between the gate voltage supply terminal G and the gate electrode 5 of the power MOSFET 2.

The use of the diode D1 in place of the transistor Q1 is advantageous because generally the forward voltage of the diode D1 will be lower than the voltage drop across the transistor Q1 when it is conducting, so enabling the overall resistance $R_{TOT}$ to be reduced even further thereby allowing the gate of the power semiconductor device 2 to be pulled closer to the source voltage (ie the voltage on line 7) when the gate voltage supply terminal G is pulled to the source voltage in order to turn off the power semiconductor device 2. For example, in this case the gate 5 of the power semiconductor device 2 may, depending upon the precise electrical characteristics of the various components, be pulled down to approximately 0.7 volts as compared to 1.0 volts in the example of FIG. 1. Consequently, the turn-off delay time and fall time of the gate 5 voltage will be less than in the example of FIG. 1.

Figure 3:
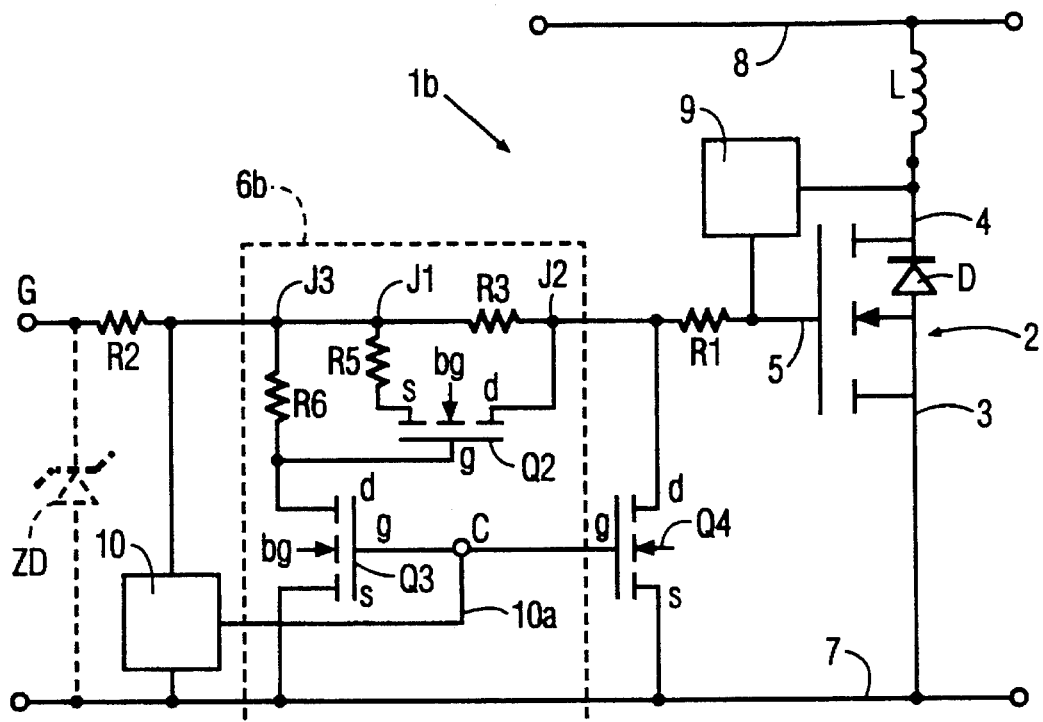
FIG. 3 is a circuit diagram of a second embodiment of a power semiconductor device circuit in accordance with the invention.

FIG. 3 illustrates another embodiment of a power semiconductor device circuit 1b in accordance with the invention.

In the example illustrated in FIG. 3, a voltage clamping circuit 9 is coupled between the second main (the drain in the example shown) electrode 4 and the gate electrode 5 of the power semiconductor device 2 so that, in the event of an overvoltage due, for example, to the switching of an inductive load L, the voltage clamping circuit 9 acts to raise the gate voltage of the power MOSFET 2 to turn the power MOSFET 2 back on so as to enable the excessive energy in the inductive load L to be dissipated by the conduction of the power MOSFET 2.

The voltage clamping circuit 9 may be of any suitable type. For example, the voltage clamping circuit 9 may consist simply of a chain of zener diodes which breakdown when the voltage at the second main electrode 4 exceeds the predetermined value, or a circuit similar to that described in U.S. Pat. No. 4,928,053, EP-A-372820 or EP-A-523800, the latter EP-A corresponding to U.S. Pat. No. 5,401,996 (Mar. 28, 1995), could be used.

The gate control circuit 6b comprises an n-channel enhancement mode IGFET Q2 having its main current path connected in series with a resistor R5 across the resistor R3 so that the resistor R5 is coupled to the junction J1 and the drain electrode of the transistor Q2 is coupled to the junction J2. The insulated gate electrode of the transistor Q2 is coupled via a resistor R6 to a junction J3 between the junction J1 and the resistor R2 and via the main current path of an n-channel enhancement mode IGFET Q3 to the supply line 7. The gate electrode of the transistor Q3 is coupled to a control input signal terminal C.

A fault detection circuit 10 is coupled to the gate terminal G via the resistor R2 and to the first power supply line. The fault detection circuit 10 has a control output 10a for supplying a control output signal for switching off the power semiconductor device 2 when an abnormal condition is detected.

The fault detection circuit 10 may be any circuit suitable for indicating an abnormal condition which requires that the power semiconductor device 2 be switched off. Thus, for example, the fault detection circuit 10 may be designed to detect when the temperature of the power semiconductor device 2 exceeds a predetermined desirable maximum temperature. In such a case any suitable overtemperature detection circuit may be used, for example, that described in our copending European Patent Application Publication No. 523799, which corresponds to U.S. Pat. No. 5,336,943 (Aug. 9, 1994). As another alternative or as an additional fault detection circuit, a circuit such as described in our copending European Patent Application Publication No. 479362, which corresponds to U.S. application Ser. No. 760,560, filed Sep. 16, 1991 may be used to detect when the temperature difference across a semiconductor body incorporating the power semiconductor device exceeds a predetermined limit.

The control output 10a of the fault detection circuit 10 is coupled to the control gate of an n-channel enhancement mode IGFET or transistor Q4 having its drain electrode coupled via resistor R1 to the gate electrode of the power semiconductor device 2 and directly to the junction J2 and its source electrode coupled to the first power supply line 7.

In this example, the control output 10a of the fault detection circuit 10 is also coupled to the control electrode of the transistor Q3 at the point C.

Figure 4:
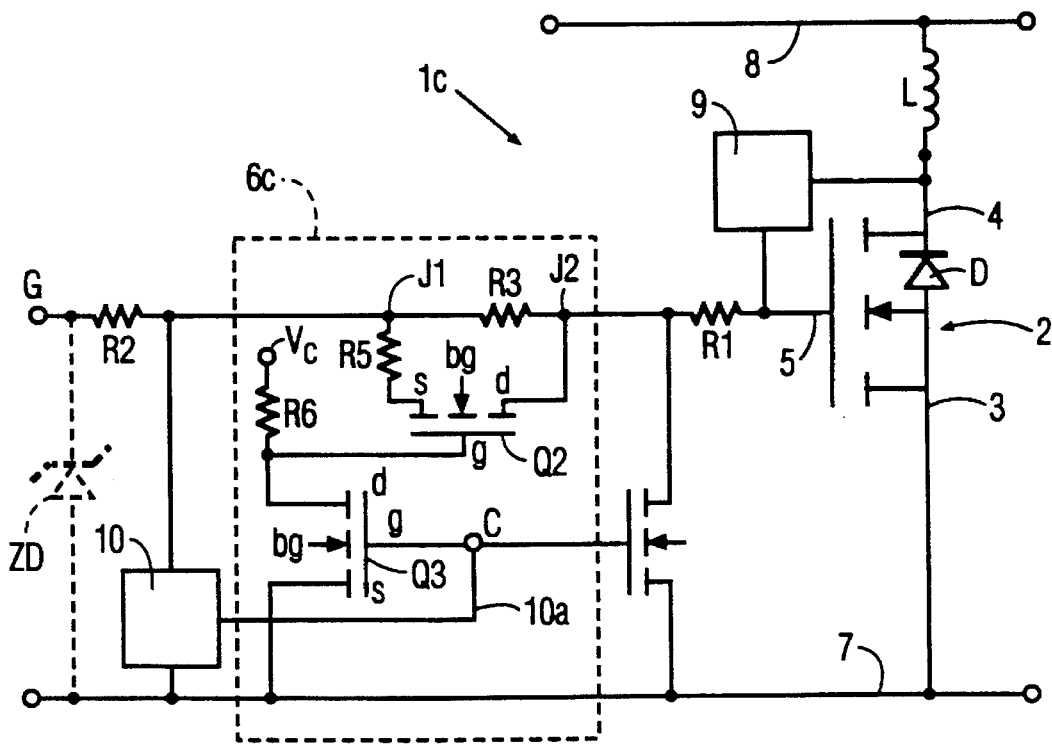
FIG. 4 is a circuit diagram of a third embodiment of a power semiconductor device circuit in accordance with the invention.

FIG. 4 illustrates a modified version of a circuit 1c in accordance with the invention which differs from that shown in FIG. 3 simply by the fact that the resistor R6 is coupled to a separate reference voltage $V_c$ rather than to the junction J3. This allows the voltage Vc to be closer to the gate voltage than the voltage at junction J3 in FIG. 3 so enabling a higher voltage to be applied to the gate of transistor Q2.

In operation of the circuit 1b or 1c, the power semiconductor device 2 when normally off is switched on by the application of an appropriate gate voltage to the gate terminal G. During the normal turn-on process, the transistor Q3 is not conducting and so the gate of transistor Q2 is high and the transistor Q2 is conducting, coupling the resistor R5 and the resistance of the series transistor Q2 in parallel with the resistor R3. The situation will be similar during turn off of the power semiconductor device 2 by removal of the gate voltage. Thus, under normal operating conditions, the total resistance from the gate terminal G to the gate electrode 5 is R1+R2+Rx where $$\frac{1}{Rx} = \frac{1}{R3} + \frac{1}{R5}$$

the resistance of the transistor Q2 when conducting being negligible.

If the fault detection circuit 10 detects an abnormal condition, for example, an overtemperature of the power semiconductor device 2, a control output signal is provided on the output 10a to turn on the transistor Q4 thereby coupling the gate electrode 5 of the power semiconductor device 2 to the supply line 7 and so turning off the power semiconductor device 2. At the same time the control output signal is provided via the junction C to the control electrode of the transistor Q3 rendering the transistor Q3 conducting, which lowers the gate voltage of the transistor Q2 which becomes non-conducting. The resistor R5 and transistor Q2 thus no longer provide a conductive path in parallel with the resistor R3 and accordingly the overall resistance of the conductive path from the gate terminal G to the gate electrode 5 is increased to R1+R2+R3. Thus, the resistance of the path from the junction J2 to the gate terminal G is increased, so facilitating the pulling down by the transistor Q4 of the power semiconductor device 2 gate electrode and increasing the resistance of the conductive path to the gate drive circuit (not shown) coupled to the gate terminal G to make it more difficult for the gate drive circuit to try and maintain the power semiconductor device 2 in a conducting state. Thus, this circuit assists in inhibiting the gate drive circuit from acting in opposition to the fault detection circuit 10 which is aiming to switch the power semiconductor device 2 off.

Consider now the situation where the power semiconductor device 2 is being used to switch, for example, an inductive load such as a motor or coil. When the power semiconductor device 2 is turned off by removal of the gate voltage, the inductive load L causes a rapid rise in the voltage at the second main electrode 4 which, if the predetermined voltage is reached, causes the voltage clamping circuit 9 to conduct in order to raise the gate voltage of the power semiconductor device 2 to render it conducting so as to dissipate the energy in the inductive load L and thus avoid any destructive breakdown of the power semiconductor device 2. Although not shown in FIG. 3 or 4, a control circuit may be provided to supply an auxiliary control signal to the junction C when the voltage clamping circuit 9 is rendered conducting to raise the voltage of the gate of the transistor Q3, so rendering the transistor Q3 conducting to lower the gate voltage of the transistor Q2 which becomes non-conducting. The resistor R5 and transistor Q2 in this case then no longer provide a conductive path in parallel with the resistor R3 and accordingly the overall resistance of the conductive path from the gate terminal G to the gate electrode 5 is increased to R1+R2+R3. In particular, the resistance of the path from the voltage clamping circuit 9 to the gate terminal G is increased so that the current through the voltage clamping circuit 9 cannot be dissipated by the gate drive circuit (not shown) but is used directly to raise the gate voltage of the power semiconductor device 2, so increasing the speed at which the voltage clamping circuit 9 turns on the power semiconductor device 2.

Figure 5:
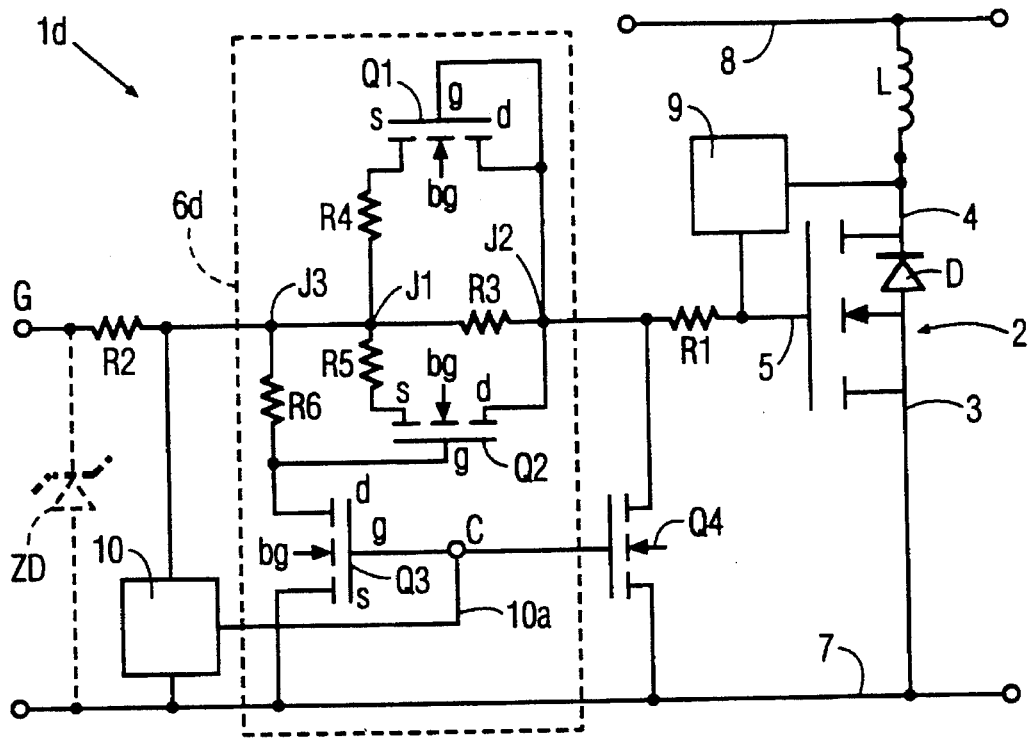
FIG. 5 is a circuit diagram for a fourth embodiment of a power semiconductor device circuit in accordance with the invention.

FIG. 5 illustrates a further example of a circuit 1d in accordance with the invention. In this example, the gate control circuit 6d includes both the transistor Q1 and series resistor R4 for increasing the speed of normal turn-off of the power semiconductor device 2 as described above with reference to FIG. 1, and an arrangement similar to that shown in FIG. 3.

Figure 6:
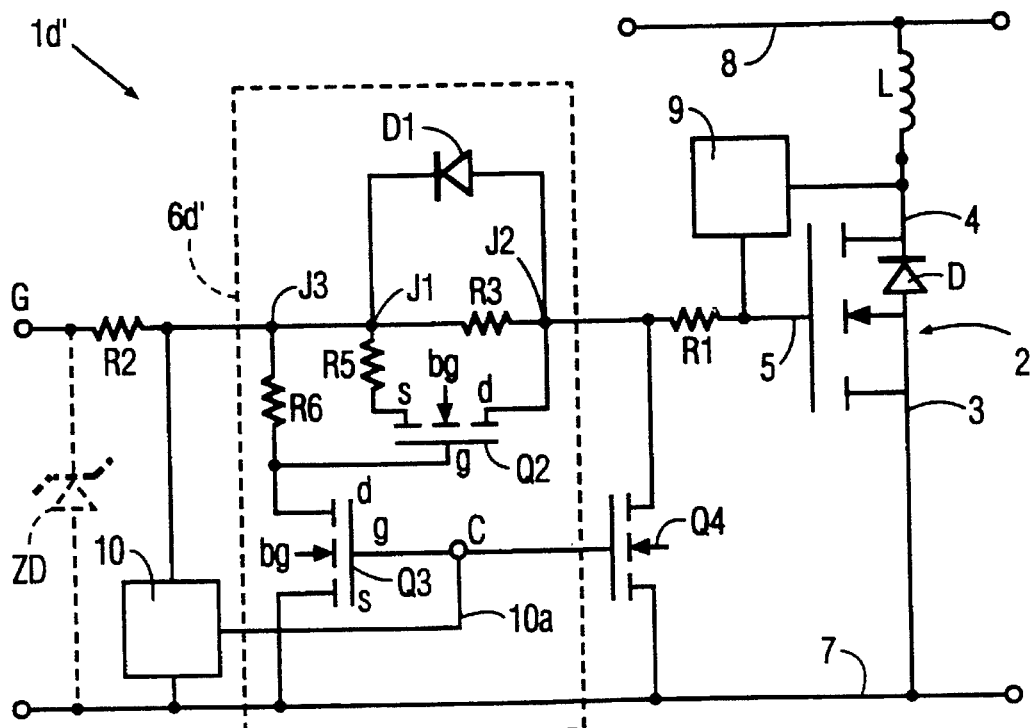
FIG. 6 is a circuit diagram of a modified version of the fourth embodiment.

FIG. 6 illustrates a modified version 1d' of the circuit 1d in accordance with the invention. In this example, the gate control circuit 6d' includes both the diode D1 for increasing the speed of normal turn-off of the power semiconductor device 2 as described above with reference to FIG. 2, and an arrangement similar to that shown in FIG. 3.

The resistor R3 may, typically, have a value of 50 kΩ (kilo-ohms) while the resisters R4, R5 and R6 may have typically values of 100 or 200 kΩ, 1 to 10 kΩ and 100 or 200 kΩ, respectively, and the resisters R1 and R2 have values of 100 Ω to 1 kΩ.

One or more input protection zener diodes may be connected between the gate input terminal G and the supply line 7 as indicated by the zener diode 2D in FIG. 4.

The transistors Q1, Q2, Q3 are generally lateral IGFETs and together with the resisters R1, R2, R3, R4, R5, R6 may be integrated in the same semiconductor body as the power semiconductor device 2. The resisters may be diffused resisters provided within the semiconductor body or thin film (eg polycrystalline) resisters provided on and insulated from the surface of the semiconductor body, as appropriate.

It will have been noticed in the drawings that the back gates bg of the transistors Q1, Q2, Q3 are not shown shorted to their respective sources as is conventional. In fact this may be the case, or the back gates could be coupled to a suitable reference potential, for example, by being connected to the supply line 7.

The circuit could also include other monitoring and control elements, for example, sensors for detecting the temperature of the power semiconductor device.

The power semiconductor device 2 need not necessarily be a power MOSFET but could, for example, be an insulated gate bipolar transistor IGBT.

Also, although the power semiconductor device 2 is an n-channel device in the examples described above, the present invention could be applied to a p-channel device with appropriate changes in voltages etc. Similarly, although the Figures show a low-side switch the present invention could be applied to a high-side switch.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

What is claimed is:

1. A power semiconductor device circuit comprising: a field effect power semiconductor device having first and second main electrodes and a gate electrode independent of said first and second main electrodes, and a gate control circuit providing a conductive path between the gate electrode and a gate voltage supply terminal providing a switching voltage to turn the power semiconductor device on and off, the gate control circuit comprising; a first resistance coupled between the gate electrode and the gate voltage supply terminal and a switching device having first and second main electrodes coupled to the gate voltage supply terminal and the gate electrode, respectively, so that a main current path between the first and second main electrodes of the switching device is coupled in parallel with the first resistance, the switching device having a first non-conducting state and a second conducting state for coupling, in the second conducting state, an additional resistance element in parallel with the first resistance, which additional resistance element includes a second resistance connected in series circuit with the switching device and with said series circuit coupled in parallel with the first resistance, the switching device being arranged to switch from one of the first and second states to the other in response to the switching voltage at the gate voltage supply terminal so as to alter the overall resistance of the conductive path between the gate electrode and the gate voltage supply terminal.

2. A power semiconductor device circuit comprising:

an insulated gate field effect power semiconductor device having first and second main electrodes and a gate electrode, and a gate control circuit providing a conductive path between the gate electrode and a gate voltage supply terminal, wherein the gate control circuit comprises:

a first resistance coupled between the gate electrode and the gate voltage supply terminal, and a switching device having first and second main electrodes coupled to the gate voltage supply terminal and the gate electrode, respectively, so that a main current path between the first and second main electrodes of the switching device is coupled in parallel with the first resistance, both the first resistance and the switching device being coupled to the gate electrode without being coupled to the first and second main electrodes of the power semiconductor device, the switching device, having a first non-conducting state and a second conducting state for coupling, in the second conducting state, an additional resistance in parallel with the first resistance, which additional resistance includes a second resistance connected in series circuit with the switching device and with said series circuit coupled in parallel with the first resistance, the switching device being arranged to switch from one of the first and second states to the other so as to alter the overall resistance of the conductive path between the gate electrode and the gate voltage supply terminal upon switching of the power semiconductor device by a gate voltage applied to the gate electrode.

3. A power semiconductor device circuit according to claim 2, wherein the switching device comprises a rectifying diode coupled in parallel with the first resistance.

4. A power semiconductor device circuit according to claim 3, wherein the rectifying diode is arranged so as to conduct when a gate voltage at the gate voltage supply terminal changes in order to turn the power semiconductor device off.

5. A power semiconductor device circuit according to claim 2, wherein the switching device comprises a switching transistor and means are provided for applying a control signal to a control electrode of the switching transistor to cause the switching transistor to switch between the first and second states.

6. A power semiconductor device circuit according to claim 5, wherein the gate control circuit is provided to facilitate turn off of the power semiconductor device when the gate voltage is removed from the gate voltage supply terminal, and wherein the switching transistor comprises an insulated gate field effect transistor and the control signal applying means comprises a coupling between the control electrode of the switching transistor and the gate electrode of the power semiconductor device for causing the switching transistor to be rendered conducting when the gate voltage is removed from the gate voltage supply terminal thereby reducing the overall resistance between the gate electrode and the gate voltage supply terminal.

7. A power semiconductor device circuit comprising: a field effect power semiconductor device having first and second main electrodes and a gate electrode independent of said first and second main electrodes, and a gate control circuit providing a conductive path between the gate electrode and a gate voltage supply terminal providing a switching voltage to turn the power semiconductor device on and off, wherein the gate control circuit facilitates turn off of the power semiconductor device when the gate voltage is removed from the gate voltage supply terminal and comprises; a resistance coupled between the gate electrode and the gate voltage supply terminal and a switching device having first and second main electrodes coupled to the gate voltage supply terminal and the gate electrode, respectively, so that a main current path between the first and second main electrodes of the switching device is coupled in parallel with the resistance, the switching device comprising a switching transistor having a first non-conducting state and a second conducting state for coupling, in the second conducting state, an additional resistance element in parallel with the resistance, means for applying a control signal to a control electrode of the switching transistor to cause the switching transistor to switch from one of the first and second states to the other in response to the switching voltage at the gate voltage supply terminal so as to alter the overall resistance of the conductive path between the gate electrode and the gate voltage supply terminal wherein the switching transistor comprises an insulated gate field effect transistor and the control signal applying means comprises a coupling between the control electrode of the switching transistor and the gate electrode of the power semiconductor device for causing the switching transistor to be rendered conducting when the gate voltage is removed from the gate voltage supply terminal, thereby reducing the overall resistance between the gate electrode and the gate voltage supply terminal, and a fault detection circuit for detecting an abnormal condition of the power semiconductor device, the fault detection circuit having a control output for providing an output signal for switching off the power semiconductor device when an abnormal condition is detected and wherein the gate control circuit additionally comprises a second transistor having first and second main electrodes and a control electrode with the first and second main electrodes coupled to the gate voltage supply terminal and the gate electrode, respectively, so that a main current path between the first and second main electrodes of the second transistor is coupled in parallel with the first resistance, and means for applying a control signal to the second transistor comprising another resistance coupled in series with the main current path between first and second main electrodes of a third transistor to a voltage supply, the first main electrode of the third transistor being coupled to the said other resistance and to the control electrode of the second transistor so that the second transistor is normally conducting, the third transistor having a control electrode coupled to the control output of the fault detection circuit for causing, when the fault detection circuit provides an output signal indicating the existence of an abnormal condition, the third transistor to be rendered conducting thereby causing the second transistor to become non-conducting, thereby increasing the overall resistance of the conductive path between the gate voltage supply terminal and the gate electrode.

8. A power semiconductor device circuit according to claim 7 wherein a resistance is coupled in series with the second transistor.

9. A power semiconductor device circuit according to claim 7 further comprising a fault detection transistor having a control electrode coupled to the control output of the fault detection circuit and first and second main electrodes coupled to the gate electrode of the power semiconductor device and to a voltage supply, respectively, so that when the fault detection transistor is rendered conducting by the output signal from the fault detection circuit the power semiconductor device is switched off.

10. A power semiconductor device circuit according to claim 2, wherein a voltage clamping circuit is coupled between one of the first and second main electrodes and the gate electrode of the power semiconductor device for causing the power semiconductor device to be switched from a non-conducting to a conducting state when the voltage at the one main electrode exceeds a predetermined limit.

11. The power semiconductor device circuit as claimed in claim 2 further comprising:
 a second resistance coupled between the gate electrode and the gate control circuit,
 a third resistance coupled between the gate control circuit and the gate voltage supply terminal, and
 an inductor coupled between one main electrode of the power semiconductor device and a DC supply voltage terminal.

12. A power semiconductor device circuit comprising:
 an insulated gate field effect power semiconductor device having first and second main electrodes and a gate electrode, and
 a gate control circuit providing a conductive path between the gate electrode and a gate voltage supply terminal, wherein the gate control circuit comprises:
  a first resistance coupled between the gate electrode and the gate voltage supply terminal,
  a switching transistor having first and second main electrodes coupled to the gate voltage supply terminal and the gate electrode, respectively, so that a main current path between the first and second main electrodes of the switching transistor is coupled in parallel with the first resistance,
  the switching transistor having a first non-conducting state and a second conducting state for providing, in the second conducting state, an additional resistance in parallel with the first resistance so as to alter the overall resistance of the conductive path between the gate electrode and the gate voltage supply terminal, and means for applying a control signal to a control electrode of the switching transistor to cause the switching transistor to switch between the first and second states, and
  another resistance coupled in series with the switching transistor between the gate electrode and the gate voltage supply terminal.

13. The power semiconductor device circuit as claimed in claim 12 further comprising:
 means for coupling one of said first and second main electrodes of the power semiconductor device to a DC voltage supply terminal,
 a first field effect transistor coupled between the gate electrode of the power semiconductor device and said DC voltage supply terminal,
 a second resistance and a second field effect transistor connected in series circuit between the gate voltage supply terminal and the DC voltage supply terminal and with a junction point therebetween connected to the control electrode of the switching transistor, and
 a fault detection circuit for detecting an abnormal condition of the power semiconductor device, the fault detection circuit having a control output coupled to respective control electrodes of the first and second field effect transistors thereby to supply an output signal for switching off the power semiconductor device when an abnormal condition is detected.

14. A power semiconductor device circuit comprising:

an insulated gate field effect power semiconductor device having first and second main electrodes and a gate electrode, a fault detection circuit for detecting an abnormal condition of the power semiconductor device, the fault detection circuit having a control output for providing an output signal for switching off the power semiconductor device when an abnormal condition is detected, and a gate control circuit providing a conductive path between the gate electrode and a gate voltage supply terminal, the control output of the fault detection circuit being coupled to the gate control circuit, wherein the gate control circuit comprises:

a first resistance coupled between the gate electrode and the gate voltage supply terminal, a first transistor having first and second main electrodes coupled to the gate voltage supply terminal and the gate electrode, respectively, so that a main current path between the first and second main electrodes of the first transistor is coupled in parallel with the first resistance, the first transistor having a first non-conducting state and a second conducting state for providing, in the second conducting state, an additional resistance in parallel with the first resistance so as to alter the overall resistance of the conductive path between the gate electrode and the gate voltage supply terminal, the first transistor comprising an insulated gate field effect transistor having a control electrode coupled to the gate electrode of the power semiconductor device for causing the first transistor to be rendered conducting when a gate voltage is removed from the gate voltage supply terminal thereby reducing the overall resistance between the gate electrode and the gate voltage supply terminal, a second transistor having first and second main electrodes and a control electrode with the first and second main electrodes coupled to the gate voltage supply terminal and the gate electrode, respectively, so that a main current path between the first and second main electrodes of the second transistor is coupled in parallel with the first resistance, and circuit means comprising a further resistance and a third transistor for applying a control signal to the second transistor, wherein said further resistance is coupled in series with a main current path between first and second main electrodes of the third transistor to a voltage supply, the first main electrode of the third transistor being coupled to said further resistance and to the control electrode of the second transistor so that the second transistor is normally conducting, and wherein the third transistor has a control electrode coupled to the control output of the fault detection circuit for causing, when the fault detection circuit provides an output signal indicating the existence of an abnormal condition, the third transistor to be rendered conducting thereby causing the second transistor to become non-conducting, so increasing the overall resistance of the conductive path between the gate voltage supply terminal and the gate electrode.

15. The power semiconductor device circuit as claimed in claim 14 wherein said fault detection circuit has a control input coupled to said gate voltage supply terminal.

16. A power semiconductor device circuit comprising:

an insulated gate field effect power semiconductor device having first and second main electrodes and a gate electrode, a fault detection circuit for detecting an abnormal condition of the power semiconductor device, the fault detection circuit having a control output for providing an output signal for switching off the power semiconductor device when an abnormal condition is detected, and a gate control circuit providing a conductive path between the gate electrode and a gate voltage supply terminal, the control output of the fault detection circuit being coupled to the gate control circuit, wherein the gate control circuit comprises:

a first resistance coupled between the gate electrode and the gate voltage supply terminal, a switching diode having first and second main electrodes coupled to the gate voltage supply terminal and the gate electrode, respectively, so that a main current path between the first and second main electrodes of the switching diode is coupled in parallel with the first resistance, the switching diode having a first non-conducting state and a second conducting state for providing, in the second conducting state, an additional resistance in parallel with the first resistance so as to alter the overall resistance of the conductive path between the gate electrode and the gate voltage supply terminal, the switching diode being arranged so as to conduct when the gate voltage supply terminal changes in order to turn the power semiconductor device off, a switching transistor having first and second main electrodes and a control electrode and with the first and second main electrodes coupled to the gate voltage supply terminal and the gate electrode, respectively, so that a main current path between the first and second main electrodes of the switching transistor is coupled in parallel with the first resistance, and circuit means comprising another resistance and a further transistor for applying a control signal to the switching transistor, said other resistance being coupled in series with a main current path between first and second main electrodes of the further transistor to a voltage supply, the first main electrode of the further transistor being coupled to said other resistance and to the control electrode of the switching transistor so that the switching transistor is normally conducting, the further transistor having a control electrode coupled to the control output of the fault detection circuit for causing, when the fault detection circuit provides an output signal indicating the existence of an abnormal condition, the further transistor to be rendered conducting thereby causing the switching transistor to become non-conducting, so increasing the overall resistance of the conductive path between the gate voltage supply terminal and the gate electrode.

17. A power semiconductor device circuit comprising:

an insulated gate field effect power semiconductor device having first and second main electrodes and a gate electrode, a fault detection circuit for detecting an abnormal condition of the power semiconductor device, the fault detection circuit having a control output for providing an output signal for switching off the power semiconductor device when an abnormal condition is detected, and a gate control circuit providing a conductive path between the gate electrode and a gate voltage supply terminal, the control output of the fault detection circuit being coupled to the gate control circuit, wherein the gate control circuit comprises:

a first resistance coupled between the gate electrode and the gate voltage supply terminal, a switching transistor having first and second main electrodes coupled to the gate voltage supply terminal and the gate electrode, respectively, so that a main current path between the first and second main electrodes of the switching transistor is coupled in parallel with the first resistance, the switching transistor having a first non-conducting state and a second conducting state for providing, in the second conducting state, an additional resistance in parallel with the first resistance so as to alter the overall resistance of the conductive path between the gate electrode and the gate voltage supply terminal, the switching transistor being conductive in the absence of a control output signal which indicates the existence of an abnormal condition, another transistor having its main electrodes coupled between the gate electrode and one of the first and second main electrodes of the power semiconductor device for enhancing the switching off of the power semiconductor device, the other transistor being non-conducting in the absence of a control output signal indicating the existence of an abnormal condition, and the control output of the fault detection circuit being coupled to control electrodes of both the switching transistor and the other transistor for causing, when the fault detection circuit provides a control output signal indicating the existence of an abnormal condition, the switching transistor to be rendered non-conducting and the other transistor to be rendered conducting.

18. A power semiconductor device circuit according to claim 17, further comprising a voltage clamping circuit coupled between the other of the first and second main electrodes and the gate electrode of the power semiconductor device for causing the power semiconductor device to be switched from a non-conducting to a conducting state when the voltage at the said other main electrode exceeds a predetermined limit.

19. The power semiconductor device circuit as claimed in claim 17 comprising a further transistor having first and second main electrodes coupled to the gate voltage supply terminal and the gate electrode, respectively, so that a main current path between the first and second main electrodes of the further transistor is coupled in parallel with the first resistance, the further transistor having a first non-conducting state and a second conducting state for providing, in the second conducting state, a further additional resistance in parallel with the first resistance so as to alter the overall resistance of the conductive path between the gate electrode and the gate voltage supply terminal, the further transistor comprising an insulated gate field effect transistor having a control electrode coupled to the gate electrode of the power semiconductor device for causing the further transistor to be rendered conducting when a gate voltage is removed from the gate voltage supply terminal thereby reducing the overall resistance between the gate electrode and the gate voltage supply terminal.

* * * * *